United States Patent
Sobieraj et al.

(10) Patent No.: US 10,401,724 B2
(45) Date of Patent: Sep. 3, 2019

(54) PELLICLE REPLACEMENT IN EUV MASK FLOW

(71) Applicant: GLOBALFOUNDRIES INC., Grand Cayman (KY)

(72) Inventors: Oktawian Sobieraj, Ballston Lake, NY (US); Paul W. Ackmann, Gansevoort, NY (US); SherJang Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 130 days.

(21) Appl. No.: 15/805,179

(22) Filed: Nov. 7, 2017

(65) Prior Publication Data
US 2019/0137863 A1    May 9, 2019

(51) Int. Cl.
| | |
|---|---|
| *G03F 1/62* | (2012.01) |
| *G03F 1/22* | (2012.01) |
| *G03F 1/64* | (2012.01) |
| *G03F 1/84* | (2012.01) |
| *G03F 7/20* | (2006.01) |

(52) U.S. Cl.
CPC .................. *G03F 1/62* (2013.01); *G03F 1/22* (2013.01); *G03F 1/64* (2013.01); *G03F 1/84* (2013.01); *G03F 7/2004* (2013.01)

(58) Field of Classification Search
CPC ..... G03F 1/22; G03F 1/62; G03F 1/64; G03F 1/84; G03F 7/2004
USPC ........................................ 430/5, 30; 382/144
See application file for complete search history.

(56) References Cited

U.S. PATENT DOCUMENTS

| | | |
|---|---|---|
| 5,928,817 A | 7/1999 | Yan et al. |
| 6,147,394 A | 11/2000 | Bruce et al. |
| 6,228,552 B1 | 5/2001 | Okino et al. |
| 6,559,953 B1 | 5/2003 | Davids |
| 6,623,893 B1 | 9/2003 | Levinson et al. |
| 2005/0221199 A1 | 10/2005 | Sandstrom |

*Primary Examiner* — Christopher G Young
(74) *Attorney, Agent, or Firm* — Gibb & Riley, LLC; Michael J. LeStrange, Esq.

(57) ABSTRACT

An optical mask has a first pellicle attached. The optical mask is inspected with the first pellicle in place using first wavelengths of electromagnetic radiation. The first pellicle is replaced with a second pellicle. The first pellicle only allows the first wavelengths of electromagnetic radiation to pass, and the second pellicle allows second wavelengths that are shorter than the first wavelengths to pass. A photoresist is exposed using the optical mask with the second pellicle in place. The second pellicle is replaced with the first pellicle. The optical mask is again inspected with the first pellicle in place using the first wavelengths of electromagnetic radiation.

20 Claims, 3 Drawing Sheets

PELLICLE REPLACEMENT IN EUV MASK FLOW

BACKGROUND

Field of the Invention

The present disclosure relates to optical masks used in photolithography, and more specifically, to pellicle use on extreme ultraviolet (EUV) masks.

Description of Related Art

Multi-layer integrated circuit (IC) devices are generally formed layer-by-layer. Conductors, insulators, or semiconductors can be formed within these layers through patterned implantation processes, patterned deposition processes, patterned material removal processes, etc. Such patterned processes generally use photolithographic masks to achieve the desired patterns.

In one example, when patterning materials in photolithographic processes, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern using an optical mask, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist. The resist is subsequently removed to leave the underlying material patterned according to the light exposure pattern (or a negative image thereof).

For example, actinic radiation is electromagnetic radiation that can produce photochemical reactions in photoresists, and the actinic radiation may be ultraviolet rays; X-rays; the i-line, h-line or g-line of low pressure mercury lamp light beam; a xenon lamp beam; a deep UV beam such as KrF, ArF or F2 excimer laser beam; a synchrotron orbital radiation beam (SOR); an electron beam (EB); γ-rays; an ion beam, etc.

As feature sizes are reduced, the technology of the optical masks improves. For example some optical masks have transparent regions that allow light to pass in a specific pattern, and other masks, such as extreme ultraviolet (EUV) masks achieve dramatic size reduction using reflective masks with patterned elements that change the light reflected by the EUV mask into a desired pattern of light and dark regions.

Such optical masks use protective films (that are often referred to as pellicles) to protect the optical masks from damage. While pellicles can be made transparent and left in place for transparent optical masks, with reflective masks (e.g., EUV masks) the pellicles are generally removed during exposure, inspection, etc., which makes the reflective masks highly susceptible to damage when the pellicle is not in place.

SUMMARY

Various methods herein receive or manufacture an extreme ultraviolet (EUV) mask. EUV masks have reflective optical characteristics and are capable of operating with very small wavelength light (e.g., shorter than 15 nm) to pattern very small features in the photoresist. These methods mount a first pellicle on the EUV mask using a pellicle frame (studs), or receive the EUV mask with the first pellicle already mounted. The first pellicle is generally mounted before the EUV mask leaves the mask house, and the EUV mask is transported with the first pellicle in place. The first pellicle only allows wavelengths of electromagnetic radiation longer than EUV wavelengths to pass.

These methods replace the first pellicle with a second pellicle before exposure. The second pellicle is also connected to the EUV mask using the pellicle frame. Such methods expose a photoresist to EUV wavelengths of light using the EUV mask with the second pellicle in place. While the manufacturing of the mask is performed in a mask house, the exposing process is performed in a wafer fabrication area. After the exposing process has been completed, these methods replace the second pellicle with the first pellicle.

The second pellicle allows EUV wavelengths (e.g., shorter than 15 nm) of electromagnetic radiation to pass. In order to allow such small wavelengths of light to pass, the second pellicle is generally silicon (such as polysilicon), carbon nanotubes, or any other similar materials that are in development; while, in contrast, the first pellicle is generally a thicker, stronger organic polymer. Thus, the second pellicle is a film that has a thickness (e.g., less than 75 nm, less than 60 nm, etc.) that is less than half, less than one-quarter, etc., the thickness (e.g., 300 nm, 250 nm, etc.) of the film of the first pellicle. Therefore, the second pellicle is structurally weaker than the first pellicle, and is more easily damaged relative to the first pellicle. Attaching the second pellicle only during exposure, and attaching the first pellicle at all other times in the processing, substantially reduces the risk of damaging the underlying optical mask because the structurally stronger first pellicle protects the optical mask at all times, other than during the exposure processing. Thus, the methods herein transport, handle, and inspect the EUV mask with the first pellicle in place, using wavelengths of electromagnetic radiation longer than EUV wavelengths.

After a maximum number of exposures have occurred, these methods dispose of (or refinish) the EUV mask; however, the first pellicle is retained at the wafer fabrication location. Therefore, the first pellicle is later attached to a different EUV mask, and the processes of transporting the pellicle, inspecting the pellicle, etc., are performed using the different EUV mask with the original first pellicle attached.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
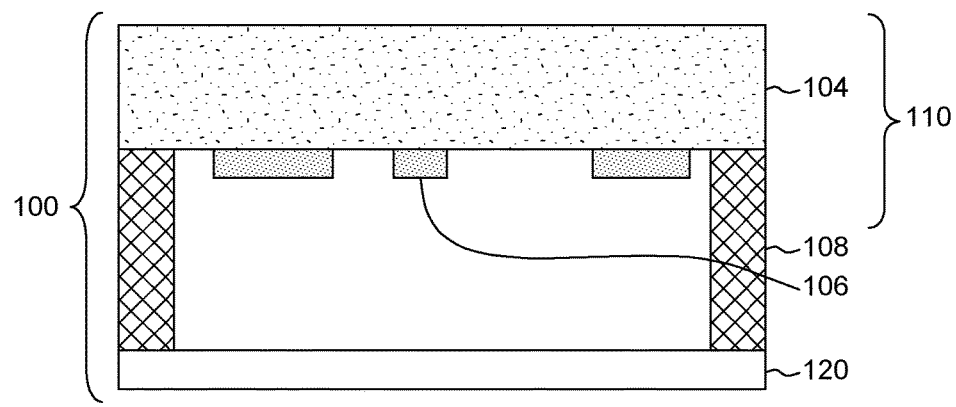
FIGS. 1-3 are schematic cross-sectional diagram illustrating optical masks according to embodiments herein.

As mentioned above, pellicles can be left in place for transparent optical masks, and with reflective masks (e.g., EUV masks) the pellicles are generally removed during exposure, inspection, etc., which makes the reflective masks highly susceptible to damage when the pellicle is not in place. For ease of explanation herein, non-EUV items operate in wavelengths above 15 nm, while EUV items operate in wavelengths of 15 nm and less.

Pellicles are generally mounted on the optical mask in a mask house. For transparent (non-reflective, non-EUV) masks, non-EUV pellicles are permanently attached (glued to the mask surface). Further, such non-EUV pellicle film membranes are compatible with inspection processes that generally occur at wavelengths longer than those used when exposing EUV masks (e.g., 193-nm inspection). Only when the transparent masks are recycled/refinished at the mask house are the pellicles removed, to allow various mechanical and chemical handling/refinishing processes to occur.

However, much shorter wavelength masks (reflective masks, EUV masks, etc.) are handled differently. Non-EUV pellicles used to protect EUV masks during transport and inspection cannot remain attached to EUV masks during exposure because such non-EUV pellicles do not allow the shorter EUV wavelengths to pass. Therefore, while EUV masks commonly leave the mask house with a non-EUV pellicle attached, the non-EUV pellicles are removed before EUV exposure processes, which risks contamination and damage to the EUV mask.

Alternatively, different pellicles that are capable of allowing EUV wavelengths to pass could be attached to EUV masks. Such EUV pellicles generally have very low (e.g., less than 20%) absorption rates for short wavelengths (shorter than 15 nm) so as not to interfere with the EUV exposure process. However, such EUV pellicles are very thin and structurally weak and do not provide as much protection as the thicker, stronger non-EUV pellicles, and are therefore not generally used because they are easily damaged. Additionally, EUV pellicles (if used) would have to be removed during inspection because EUV pellicle films are not compatible with longer wavelength 193-nm inspection. Such inspections are generally termed "non-actinic" because they do not utilize actinic radiation (which is electromagnetic radiation that can produce photochemical reactions) during the inspections. Therefore, conventionally EUV pellicles are not used because of the risk of damage and inability to provide easy inspection, and instead non-EUV pellicle are used for transport and inspection (and are simply removed before exposure).

In contrast to what is done conventionally, the methods herein protect the EUV mask at all times starting from post-final cleaning step in the mask house, using both EUV and non-EUV pellicles. The pellicles are switched based on a predefined flow, so that the proper pellicle that is compatible with each process flow step's requirements is in place at each of the different steps. More specifically, the pellicle is switched from one with an organic polymer non-EUV film (e.g., ArF excimer laser beam compatible film) to a pellicle with silicon-based (e.g., polysilicon) EUV compatible film, for exposure only. Therefore, the methods herein use a dedicated non-EUV pellicle for handling and inspection, but switch to a EUV compatible pellicle for EUV exposure processing, and then switch back after exposure.

Such methods improve wafer yield by protecting the mask at each step from final handling in the mask house to exposure in the wafer fab. Further, the EUV mask is protected by the structurally stronger non-EUV pellicle during handling steps not related to EUV exposure, the EUV mask inspection (and requalification) is performed with non-actinic inspection tools that are usable with the non-EUV pellicle in place. Additionally, the non-EUV pellicle improves reliability of all the reticle activities outside the exposure scanner. These methods provide an improved, risk-free ability to perform recertification, prolong the mask lifetime, and allow pellicles to be managed separately from EUV mask (which allows the non-EUV pellicle to be used indefinitely, as they are not subjected to damage caused by the EUV scanner).

Figure 2:
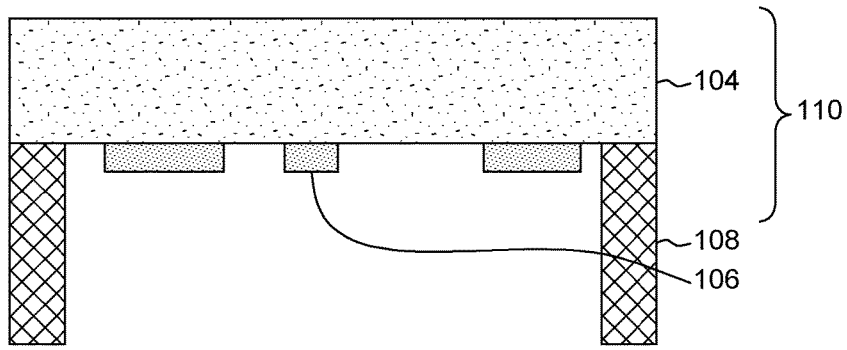
Figure 3:
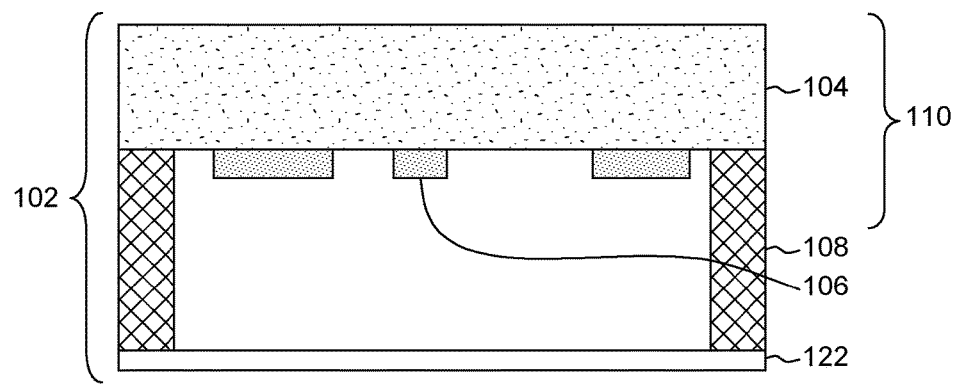

Various methods herein receive or manufacture an extreme ultraviolet (EUV) mask. As shown in FIGS. 1-3, EUV masks 110 have a reflective optical structure 104 with patterned mask features 106 of absorber material, and are capable of operating with very small wavelengths (e.g., shorter than 15 nm) to pattern very small (e.g., smaller than 10 nm) features in a photoresist. These methods mount a first, non-EUV, pellicle 120 on the EUV mask 110, or receive the EUV mask 110 with the first pellicle 120 already mounted. As shown in FIG. 1, the first pellicle 120 is connected to the EUV mask 110 using a pellicle frame 108, and this combined structure is referred to as a "first pellicle EUV mask structure 100." The first pellicle 120 is considered to be "non-EUV" because the first pellicle 120 only allows wavelengths of electromagnetic radiation longer than EUV wavelengths to pass the first pellicle 120.

As shown in FIGS. 2-3, these methods replace the first pellicle 120 with a second pellicle 122 by removing the first pellicle 120 (FIG. 2), and then attaching a different pellicle 122 to the pellicle frame 108 (FIG. 3). The combined structure that includes the second pellicle 122 connected to the EUV mask 110 using a pellicle frame 108 is referred to as a "second pellicle EUV mask structure 102." In contrast to the first pellicle 120, the second pellicle 122 allows EUV wavelengths of electromagnetic radiation to pass, but is much structurally weaker than the first pellicle.

One issue relates to how "transparent" the pellicles are, because a certain pellicle (e.g., organic polymer film) may not absorb the light energy of wavelengths of 300 nm (which are commonly used with transparent optical masks); however, the same pellicle may absorb a large portion (e.g., above 75%) of electromagnetic radiation wavelengths of 15 nm (which are commonly used with EUV masks). Further, very short wavelength exposure systems (such as EUV) use relatively high power (above 75 W) and when this power is mostly absorbed by the pellicle, the pellicle can be damaged. Thus, while the first pellicle 120 can be left in place on non-EUV masks during exposure/inspection without damage, the first pellicle 120 may not be left in place on EUV masks during exposure/inspection, because of the potential for damage to the first pellicle 120 as it will absorb a large portion of the electromagnetic radiation exposure energy.

The second pellicle 122 allows EUV wavelengths (e.g., shorter than 15 nm) of electromagnetic radiation to pass, without damage because it has very low or no absorption of such wavelengths (e.g., less than 10%). In order to allow such small wavelengths of light to pass, the second pellicle 122 is generally silicon (such as polysilicon), carbon nanotubes, or any other similar EUV materials that are in development; while, in contrast, the first pellicle 120 is generally a thicker, stronger organic polymer. Such different materials have different energy absorption characteristics allowing them to absorb or pass different wavelengths of light.

Additionally, to aid in the passage of smaller wavelengths, the second pellicle 122 is a film that has a thickness (e.g., less than 75 nm, less than 60 nm, etc.) that is less than half, less than one-quarter, etc., the thickness (e.g., 300 nm, 250 nm, etc.) of the film of the first pellicle 120. Therefore, because it is thinner and made of a different material, the second pellicle 122 is structurally weaker than the first pellicle 120, and is more easily damaged relative to the first pellicle 120. Therefore, the first pellicle 120 provides much more protection to the EUV mask 110 during transport, handling, and inspection. Attaching the second pellicle 122 to the EUV mask 110 only during exposure, and reattaching the first pellicle 120 to the EUV mask 110 at all other times in the processing, substantially reduces the risk of damaging the underlying EUV mask 110 because the structurally stronger first pellicle 120 protects the EUV mask 110 at all times, other than during the exposure processing, and the second pellicle 122 protects the EUV mask 110 during exposure processing.

Such methods thus expose a photoresist using EUV wavelength electromagnetic radiation patterned through the EUV mask 110 with the second pellicle 122 in place. Then, after the exposing process has been completed, these methods replace the second pellicle 122 with the first pellicle 120, to reproduce the first pellicle EUV mask structure 100 shown in FIG. 1. This allows the EUV mask 110 to be constantly protected by one of the pellicles (120 or 122), allows exposure of the photoresist through the second pellicle 122, and prevents the first pellicle 120 from exposure to the EUV wavelengths that could damage the first pellicle 120.

Figure 4:
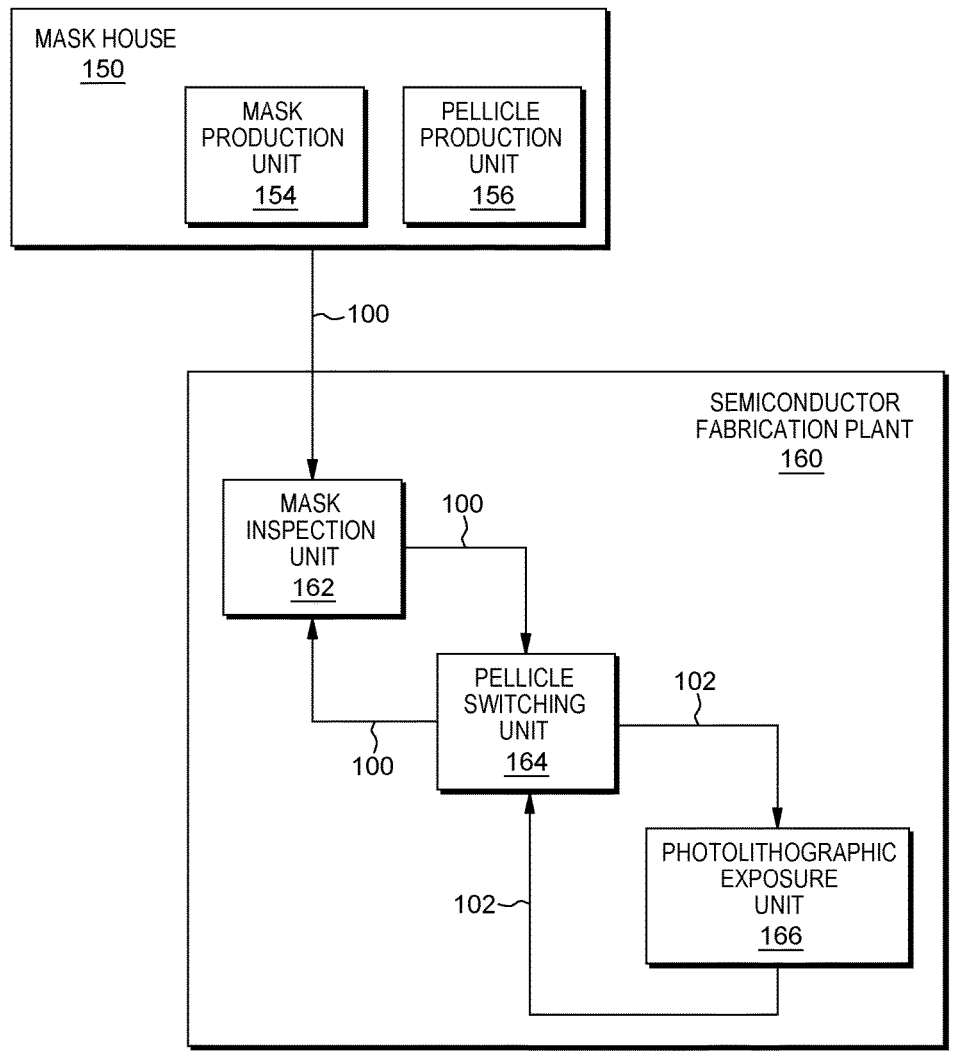
FIG. 4 is a schematic diagram of a system according to embodiments herein.

FIG. 4 illustrates that mask manufacturing could be performed in a mask house 150 that includes a mask production unit 154 and a pellicle production unit 156. The mask production unit 154 and a pellicle production unit 156 produce/combine the first pellicle 120 with to the EUV mask 110 using a pellicle frame 108, to produce the first pellicle EUV mask structure 100, which is physically transported to a different location (shipped to the semiconductor fabrication plant 160). Therefore, in some situations, the first pellicle 120 is mounted before the EUV mask 110 leaves the mask house, and the EUV mask 110 is transported with the first pellicle 120 in place.

Note that while the mask house 150 and the semiconductor fabrication plant 160 could actually be in the same physical location (or different locations), they are shown as being separate in FIG. 4 to help illustrate operations herein. Further, elements of the semiconductor fabrication plant 160 could be included in the mask house 150, and vice versa.

FIG. 4 also shows that the semiconductor fabrication plant 160 includes a mask inspection/handling unit 162 that receives and inspects the first pellicle EUV mask structure 100. The first pellicle EUV mask structure 100 is then moved to a pellicle switching unit 164, which performs the steps shown in FIGS. 2-3 above to replace the first pellicle 120 with the second pellicle 122 and produce the second pellicle EUV mask structure 102.

As further shown in FIG. 4, the second pellicle EUV mask structure 102 is moved to the photolithographic exposure unit 166 and the photoresist is exposed using EUV wavelength electromagnetic radiation patterned through the EUV mask 110 with the second pellicle 122 in place to produce patterned features in the photoresist. Then, after the exposing process has been completed, these methods replace the second pellicle 122 with the first pellicle 120, to reproduce the first pellicle EUV mask structure 100, again using the pellicle switching unit 164. After this, the first pellicle EUV mask structure 100 can be inspected before reuse by the mask inspection/handling unit 162, as shown in FIG. 4.

The EUV wavelengths of electromagnetic radiation (e.g., shorter than 15 nm, more than 75 W) can damage the first pellicle 120; however, the EUV wavelengths do not damage the second pellicle 122. The first pellicle 120 allows wavelengths of light used for inspection to pass; however, the second pellicle 122 does not. Thus, the methods herein handle and inspect the EUV mask 110 at the mask inspection/handling unit 162 with the first pellicle 120 in place, using non-EUV wavelengths of electromagnetic radiation; but pattern the photoresist in the photolithographic exposure unit 166 using EUV wavelength electromagnetic radiation patterned through the EUV mask 110 with the second pellicle 122 in place.

After a maximum number of exposures have occurred, these methods dispose of the EUV mask 110 or return the EUV mask 110 to the mask house 150 for refinishing; however, the first pellicle 120 can be retained for reuse when the EUV mask is disposed of. Therefore, the first pellicle 120 is later attached to a different EUV mask 110 at the mask house 150 (or the semiconductor fabrication plant 160), and the process of handling the pellicle, replacing the first pellicle 120 with the second pellicle 122, and exposing the photoresist, are performed using the different EUV mask 110. Thus, the "used" first pellicles 120 could be returned to the mask house 150 and mounted to different EUV masks 110 at the mask house and remain in place to protect a different EUV mask during transport, inspection, handling, etc. Either way, the first pellicles 120 are generally not damaged by the processing described above, and can be reused and reattached to new or refinished EUV masks 110, without substantial refinishing, inspection, or other similar processing being performed on the first pellicles 120.

Figure 5:
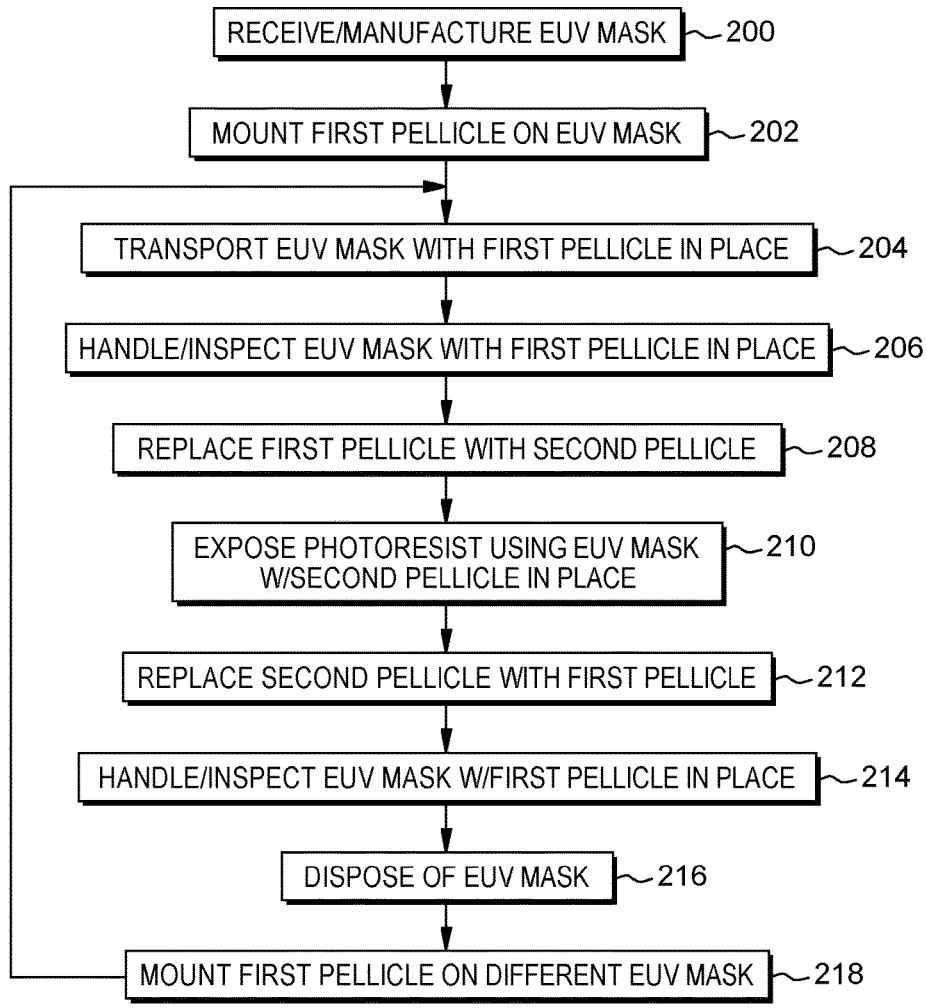
FIG. 5 is a flow diagram illustrating embodiments herein.

The flowchart in FIG. 5 illustrates such operations. As shown in item 200, these processes/methods receive or manufacture an extreme ultraviolet (EUV) mask. Again, EUV masks have reflective optical characteristics and are capable of operating with very small wavelengths (e.g., shorter than 15 nm) to pattern very small features in the photoresist.

In item 202, these methods mount a first pellicle on the EUV mask using a pellicle frame (studs). As noted above, the mounting of the first pellicle can be performed before the EUV mask leaves the mask house. The first pellicle only allows wavelengths of electromagnetic radiation longer than EUV wavelengths to pass the first pellicle. The EUV mask is transported with the first pellicle in place in item 204.

In item 206, the methods herein handle and inspect the EUV mask with the first pellicle in place, using wavelengths of electromagnetic radiation longer than EUV wavelengths. Additionally, any necessary handling of the EUV mask is preformed with the first pellicle in place in item 206.

These methods replace the first pellicle with a second pellicle in item 208. The second pellicle is also connected to the EUV mask using the pellicle frame. In contrast to the first pellicle, the second pellicle allows EUV wavelengths of electromagnetic radiation to pass. In item 210, such methods expose a photoresist using the EUV mask with the second pellicle in place. Then, after the exposing process 210 has been completed, these methods replace the second pellicle with the first pellicle in item 212.

Then, in item 214, the methods herein handle and inspect the EUV mask with the first pellicle in place, using wavelengths of electromagnetic radiation longer than EUV wavelengths. Additionally, any necessary handling of the EUV mask is preformed with the first pellicle in place in item 214.

After a maximum number of exposures have occurred, these methods dispose of, or refinish the EUV mask in item 216; however, the first pellicle is retained. Therefore, the first pellicle is later attached to a different EUV mask in item 218, and the process of transporting 204, inspecting 206, etc., are repeated using the different EUV mask with the first pellicle attached, as shown by the return arrow from item 218 to item 204.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
supplying an optical mask having a first pellicle attached;
inspecting the optical mask with the first pellicle in place using first wavelengths of electromagnetic radiation;
replacing the first pellicle with a second pellicle, wherein the first pellicle only allows the first wavelengths of electromagnetic radiation to pass, and the second pellicle allows second wavelengths that are shorter than the first wavelengths to pass;
exposing a photoresist using the optical mask with the second pellicle in place;
replacing the second pellicle with the first pellicle; and
inspecting the optical mask with the first pellicle in place using the first wavelengths of electromagnetic radiation.

2. The method according to claim 1, wherein the first pellicle comprises a first film having a first thickness, and the second pellicle comprises a second film having a second thickness that is less than half the thickness of the first film of the first pellicle.

3. The method according to claim 1, wherein the first pellicle is structurally stronger than the second pellicle.

4. The method according to claim 1, wherein the first pellicle comprises an organic polymer and the second pellicle comprises silicon.

5. The method according to claim 1, wherein first pellicle and the second pellicle are attached to the optical mask with a pellicle frame.

6. The method according to claim 1, wherein manufacturing the optical mask is performed in a mask house and the exposing is performed in a wafer fabrication area, and wherein mounting the first pellicle is performed before the optical mask leaves the mask house.

7. The method according to claim 1, wherein the first wavelengths are longer than 15 nm.

8. A method comprising:
manufacturing an extreme ultraviolet (EUV) mask;
mounting a first pellicle on the EUV mask;
transporting the EUV mask with the first pellicle in place;
inspecting the EUV mask with the first pellicle in place using wavelengths of electromagnetic radiation longer than EUV wavelengths;

replacing the first pellicle with a second pellicle, wherein the first pellicle only allows wavelengths of electromagnetic radiation longer than EUV wavelengths to pass, and the second pellicle allows EUV wavelengths of electromagnetic radiation to pass;

exposing a photoresist using the EUV mask with the second pellicle in place;

after the exposing, replacing the second pellicle with the first pellicle;

inspecting the EUV mask with the first pellicle in place using wavelengths of electromagnetic radiation longer than EUV wavelengths;

disposing of the EUV mask, wherein the first pellicle is retained when the EUV mask is disposed of; and attaching the first pellicle to a different EUV mask, and repeating the transporting and the inspecting using the different EUV mask with the first pellicle attached.

9. The method according to claim 8, wherein the first pellicle comprises a first film having a first thickness, and the second pellicle comprises a second film having a second thickness that is less than half the thickness of the first film of the first pellicle.

10. The method according to claim 8, wherein the first pellicle is structurally stronger than the second pellicle.

11. The method according to claim 8, wherein the first pellicle comprises an organic polymer and the second pellicle comprises silicon.

12. The method according to claim 8, wherein first pellicle and the second pellicle are attached to the EUV mask with a pellicle frame.

13. The method according to claim 8, wherein the manufacturing is performed in a mask house and the exposing is performed in a wafer fabrication area, and wherein the mounting the first pellicle is performed before the EUV mask leaves the mask house.

14. The method according to claim 8, wherein the EUV wavelengths are shorter than 15 nm.

15. A method comprising:

manufacturing an extreme ultraviolet (EUV) mask having reflective optical characteristics;

mounting a first pellicle on the EUV mask using a pellicle frame connected to the EUV mask, wherein the first pellicle is connected to the pellicle frame, and wherein the first pellicle only allows wavelengths of electromagnetic radiation longer than EUV wavelengths to pass the first pellicle;

transporting the EUV mask with the first pellicle in place;

inspecting the EUV mask with the first pellicle in place using wavelengths of electromagnetic radiation longer than EUV wavelengths;

replacing the first pellicle with a second pellicle, wherein the second pellicle is connected to the pellicle frame, and wherein the second pellicle allows EUV wavelengths of electromagnetic radiation to pass;

exposing a photoresist using the EUV mask with the second pellicle in place;

after the exposing, replacing the second pellicle with the first pellicle;

inspecting the EUV mask with the first pellicle in place using wavelengths of electromagnetic radiation longer than EUV wavelengths;

disposing of the EUV mask after a maximum number of exposures have occurred, wherein the first pellicle is retained when the EUV mask is disposed of; and attaching the first pellicle to a different EUV mask, and repeating the transporting and the inspecting using the different EUV mask with the first pellicle attached.

16. The method according to claim 15, wherein the first pellicle comprises a first film having a first thickness, and the second pellicle comprises a second film having a second thickness that is less than half the thickness of the first film of the first pellicle.

17. The method according to claim 15, wherein the first pellicle is structurally stronger than the second pellicle.

18. The method according to claim 15, wherein the first pellicle comprises an organic polymer and the second pellicle comprises silicon.

19. The method according to claim 15, wherein the manufacturing is performed in a mask house and the exposing is performed in a wafer fabrication area, and wherein the mounting the first pellicle is performed before the EUV mask leaves the mask house.

20. The method according to claim 15, wherein the EUV wavelengths are shorter than 15 nm.

* * * * *